（12） United States Patent
Thei et al.

(10) Patent No.: US 9,099,467 B2
(45) Date of Patent: Aug. 4, 2015

(54) E-FUSE STRUCTURE DESIGN IN ELECTRICAL PROGRAMMABLE REDUNDANCY FOR EMBEDDED MEMORY CIRCUIT

(71) Applicant: Taiwan Semiconductor Manufacturing Company, Ltd., Hsin-Chu (TW)

(72) Inventors: Kong-Beng Thei, Hsin-Chu (TW); Chung Long Cheng, Hsin-Chu (TW); Chung-Shi Liu, Hsin-Chu (TW); Harry-Hak-Lay Chuang, Singapore (SG); Shien-Yang Wu, Jhudong Town (TW); Shi-Bai Chen, Tai-Chung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/107,917

(22) Filed: Dec. 16, 2013

(65) Prior Publication Data

US 2014/0218100 A1   Aug. 7, 2014

Related U.S. Application Data

(60) Continuation of application No. 13/443,550, filed on Apr. 10, 2012, now Pat. No. 8,629,050, which is a continuation of application No. 12/503,641, filed on Jul. 15, 2009, now Pat. No. 8,174,091, which is a
(Continued)

(51) Int. Cl.
*H01L 29/00*   (2006.01)
*H01L 23/525*   (2006.01)
*H01L 23/532*   (2006.01)

(52) U.S. Cl.
CPC ....... *H01L 23/5256* (2013.01); *H01L 23/53238* (2013.01); *H01L 23/53295* (2013.01); *H01L 2924/0002* (2013.01)

(58) Field of Classification Search
CPC .................. H01L 23/53238; H01L 23/53295; H01L 2924/0002
USPC .................................. 257/528–535, E21.003
See application file for complete search history.

(56) References Cited

U.S. PATENT DOCUMENTS 4,748,491 A   5/1988   Takagi
4,796,075 A   1/1989   Whitten
(Continued)

OTHER PUBLICATIONS

Alavi, M., et al., "A PROM Element Based on Salicide Agglomeration of Poly Fuses in a CMOS Logic Process," IEDM, IEEE, Dec. 1997, pp. 855-858.
(Continued)

*Primary Examiner* — Cuong Q Nguyen
(74) *Attorney, Agent, or Firm* — Slater & Matsil, L.L.P.

(57) ABSTRACT

An electrical fuse and a method of forming the same are presented. A first-layer conductive line is formed over a base material. A via is formed over the first-layer conductive line. The via preferably comprises a barrier layer and a conductive material. A second-layer conductive line is formed over the via. A first external pad is formed coupling to the first-layer conductive line. A second external pad is formed coupling to the second-layer conductive line. The via, the first conductive line and the second conductive line are adapted to be an electrical fuse. The electrical fuse can be burned out by applying a current. The vertical structure of the preferred embodiment is suitable to be formed in any layer.

20 Claims, 11 Drawing Sheets

Related U.S. Application Data division of application No. 11/137,075, filed on May 25, 2005, now abandoned.

(60) Provisional application No. 60/583,637, filed on Jun. 29, 2004.

(56) References Cited

U.S. PATENT DOCUMENTS

| | | | |
|---|---|---|---|
| 4,862,243 | A | 8/1989 | Welch et al. |
| 5,017,510 | A | 5/1991 | Welch et al. |
| 5,272,804 | A | 12/1993 | Morrill, Jr. et al. |
| 5,371,411 | A | 12/1994 | Hara et al. |
| 5,469,981 | A | 11/1995 | Srikrishnan et al. |
| 5,521,116 | A | 5/1996 | Boku |
| 5,539,257 | A | 7/1996 | Hara et al. |
| 5,552,639 | A | 9/1996 | Hara et al. |
| 5,708,291 | A | 1/1998 | Bohr et al. |
| 5,747,868 | A | 5/1998 | Reddy et al. |
| 5,795,819 | A | 8/1998 | Motsiff et al. |
| 5,818,111 | A | 10/1998 | Jeng et al. |
| 5,854,510 | A | 12/1998 | Sur, Jr. et al. |
| 5,961,808 | A | 10/1999 | Kiyokawa |
| 6,269,745 | B1 | 8/2001 | Cieplik et al. |
| 6,271,574 | B1 | 8/2001 | Delpech et al. |
| 6,294,474 | B1 | 9/2001 | Tzeng et al. |
| 6,295,721 | B1 | 10/2001 | Tsai |
| 6,331,739 | B1 | 12/2001 | Fukuhara et al. |
| 6,368,902 | B1 | 4/2002 | Kothandaraman et al. |
| 6,372,652 | B1 | 4/2002 | Verma et al. |
| 6,400,621 | B2 | 6/2002 | Hidaka et al. |
| 6,433,404 | B1 | 8/2002 | Iyer et al. |
| 6,436,738 | B1 | 8/2002 | Yu |
| 6,440,834 | B2 | 8/2002 | Daubenspeck et al. |
| 6,444,544 | B1 | 9/2002 | Hu et al. |
| 6,451,681 | B1 | 9/2002 | Greer |
| 6,469,363 | B1 | 10/2002 | Delpech et al. |
| 6,486,557 | B1 | 11/2002 | Davis et al. |
| 6,507,087 | B1 | 1/2003 | Yu |
| 6,555,458 | B1 | 4/2003 | Yu |
| 6,566,171 | B1 | 5/2003 | Liu et al. |
| 6,638,796 | B2 | 10/2003 | Chuang |
| 6,653,710 | B2 | 11/2003 | Adkisson et al. |
| 6,654,304 | B1 | 11/2003 | Huang |
| 6,661,330 | B1 | 12/2003 | Young |
| 6,687,973 | B2 | 2/2004 | Hewson et al. |
| 6,756,655 | B2 | 6/2004 | Le et al. |
| 6,806,551 | B2 | 10/2004 | Liu et al. |
| 6,815,265 | B2 | 11/2004 | Nakatani et al. |
| 6,838,367 | B1 | 1/2005 | Rhodes |
| 6,867,441 | B1 | 3/2005 | Yang et al. |
| 6,933,591 | B1 | 8/2005 | Sidhu et al. |
| 6,972,474 | B2 | 12/2005 | Hashimoto |
| 7,095,119 | B2 | 8/2006 | Takase |
| 7,119,414 | B2 | 10/2006 | Hisaka |
| 2001/0017755 | A1 | 8/2001 | Toyoshima |
| 2001/0042897 | A1 | 11/2001 | Yeh et al. |
| 2002/0014680 | A1 * | 2/2002 | Tottori .................. 257/529 |
| 2002/0050646 | A1 | 5/2002 | Ohhashi |
| 2002/0086462 | A1 | 7/2002 | Kothandaraman et al. |
| 2002/0127809 | A1 | 9/2002 | Park et al. |
| 2002/0182881 | A1 | 12/2002 | Ni et al. |
| 2003/0127662 | A1 | 7/2003 | Duesman et al. |
| 2005/0064629 | A1 | 3/2005 | Yu et al. |
| 2005/0189613 | A1 | 9/2005 | Otsuka et al. |
| 2012/0146710 | A1 | 6/2012 | Choserot et al. |
| 2012/0196434 | A1 | 8/2012 | Thei et al. |

OTHER PUBLICATIONS

Kalnitsky, A., et al., "CoSi2 integrated fuses on poly silicon for low voltage 0.18μm CMOS applications," IEDM, IEEE, Dec. 1999, pp. 765-768.

Kothandaraman, C., et al., "Electrically Programmable Fuse (eFUSE) Using Electromigration in Silicides," IEEE Electron Device Letters, vol. 23, No. 9, Sep. 2002, pp. 523-525.

Moussavi, M., "Advanced Interconnect schemes towards 0.1μm," IEDM, IEEE, Dec. 1999, pp. 611-614.

Young, D., et al., •"Failure Mechanism Models for Electromigration," IEEE Transactions on Reliability, vol. 43, No. 2, Jun. 1994, pp. 186-192.

Ionescu, A.M., et al., "Current Trends in the Electrical Characterization of Low-K Dielectrics," IEEE, Oct. 1999, pp. 27-36.

* cited by examiner

E-FUSE STRUCTURE DESIGN IN ELECTRICAL PROGRAMMABLE REDUNDANCY FOR EMBEDDED MEMORY CIRCUIT

This application is a continuation of U.S. patent application Ser. No. 13/443,550, filed on Apr. 10, 2012, entitled "New Fuse Structure," which is a continuation of U.S. patent application Ser. No. 12/503,641, filed on Jul. 15, 2009, entitled "New Fuse Structure," now U.S. Pat. No. 8,174,091, which is a divisional of U.S. patent application Ser. No. 11/137,075, filed on May 25, 2005, entitled "New Fuse Structure," which claims the benefit of U.S. Provisional Application No. 60/583,637, filed on Jun. 29, 2004, entitled "E-Fuse Structure Design in Electrical Programmable Redundancy for Embedded Memory Circuit," which applications are hereby incorporated herein by reference.

TECHNICAL FIELD

This invention relates generally to an electrical fuse and more particularly to an electrical fuse having a vertical structure.

BACKGROUND

In the semiconductor industry, fuse elements are widely used features in integrated circuits for a variety of purposes, such as improving manufacturing yield or customizing a generic integrated circuit. For example, by replacing defective circuits on a chip with redundant circuits on the same chip, manufacturing yields can be significantly increased. Replacing defective circuits is especially useful for improving manufacturing yield of the memory chips since memory chips consist of a lot of identical memory cells and cell groups. By selectively blowing fuses within an integrated circuit that has multiple potential uses, a generic integrated circuit design may be economically manufactured and adapted to a variety of custom uses.

There are two different ways to disconnect fuses. In one way, the disconnection is carried out by the action of a laser beam, and the fuse is referred to as a laser fuse. In another way, the disconnection is carried out by electrical destruction resulting from the production of heat. The fuse is referred as an electrical fuse, or E-fuse.

Laser programmable redundancy has been widely used in large-scale memory devices. However, the laser repair rate in various structures such as in lower level metal layers is low and the process is complex. FIG. 1 illustrates a laser fuse formed close to the surface of a chip. Device 6 is a laser fuse. Oxide 5 covers the fuse 6. If the fuse 6 is to be burned out from the top of the oxide 5 by a laser, the thickness T of the oxide 5 has to be within a certain range, for example, between about 0.1 kÅ to about 4.0 kÅ. Therefore, an extra mask is needed to form opening 4, and the process has to be precisely controlled. If a laser fuse 10 is in a lower level layer deep in a chip, as shown in FIG. 2, opening 8 will be deeper, while the thickness T of the oxide still has to be controlled precisely, which increases the complexity significantly and decreases the repairable rate.

In addition, as technology is scaling down to 0.13 μm or below, copper is implemented as interconnects or power lines. Copper is a material with high current density tolerance and is not easily burned out by using a laser gun. Furthermore, the combination of copper plus low-k material 12 (used as inter-layer dielectrics) is becoming a trend to improve RC delay. However, low-k material 12 cracks easily when etching the opening 8 in FIG. 2. This decreases the device reliability and increases the production cost.

Electrical fuses were developed to improve repairable rates. FIG. 3 illustrates a conventional electrical fuse 13. A polysilicon strip 15 is formed and patterned. The regions 14 and 16 of the polysilicon strip 15 are doped with p+ and n+ dopant. The central region 18 is left un-doped. A silicide 20 is formed over the polysilicon strip 15. Before the fuse 13 is burned out, its resistance is mainly determined by the resistance of the silicide 20 so that the resistance is low. When a predetermined programming potential is applied across the silicide layer 20 from nodes 22 and 24, the silicide layer 20 agglomerates to form an electrical discontinuity. Therefore the resistance of the fuse 13 is mainly determined by the underlying polysilicon strip 15 so that the resistance is significantly increased. The central un-doped region 18 makes the fuse resistance higher. The electrical fuse shown in FIG. 3 typically has a higher repairable rate than a laser fuse. However, the repairable rate is still not satisfactory. Additionally, the fuse of FIG. 3 is formed laterally and occupies more layout space.

There are several disadvantages faced by conventional methods of making fuses. Firstly, the repairable rate is typically low. Secondly, the additional masking layer needed for laser repair incurs higher costs. The process is also more complex with higher uncertainty. Thirdly, the structure design is not flexible. Fuses typically have to be designed in higher layers, as it is harder to form deep laser trenches through to lower layers. Therefore, new methods of designing e-fuses are needed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention present a novel method of forming e-fuses. A via connecting a lower-layer conductive line and an upper-layer conductive line is adapted to be an e-fuse. The e-fuse can be burned out by applying a voltage on external pads that are coupled to the lower-layer conductive line and the upper-layer conductive line. Throughout the description, conductive lines are also referred to as conductive layers.

Figure 1:
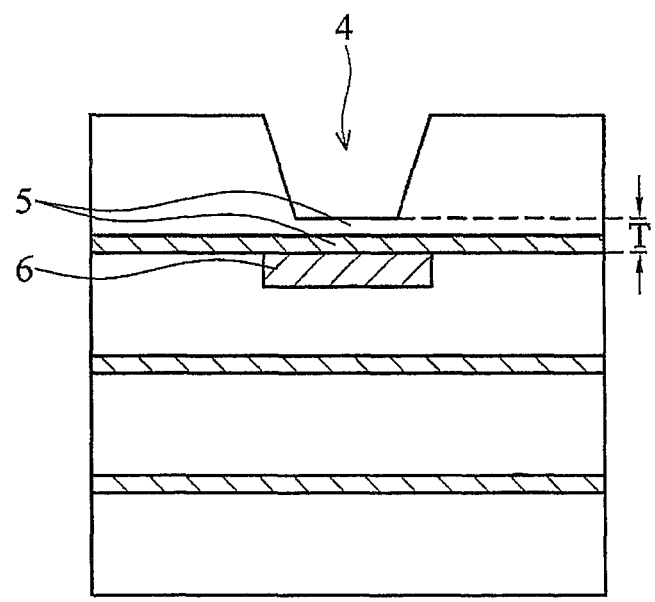
FIG. 1 illustrates a laser fuse formed close to the surface of a chip.
Figure 2:
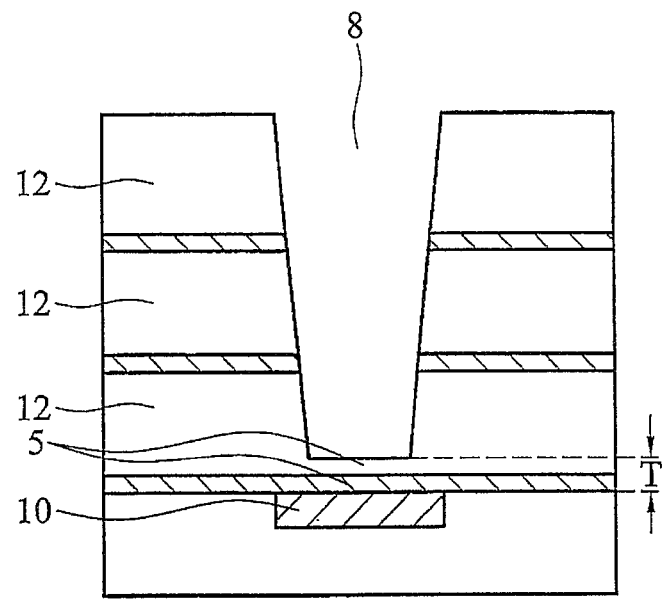
FIG. 2 illustrates a laser fuse formed deep in a chip.
Figure 3:
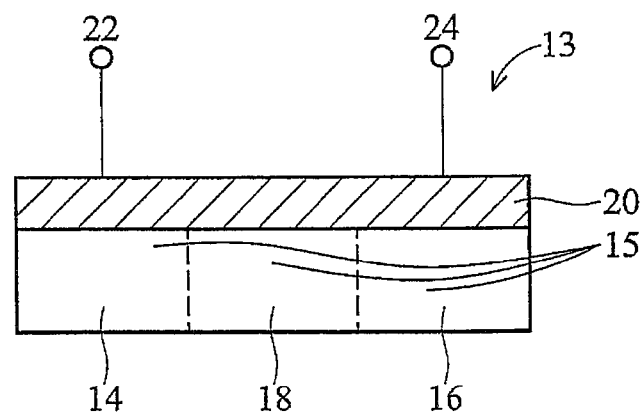
FIG. 3 illustrates a conventional electrical fuse.
Figure 4:
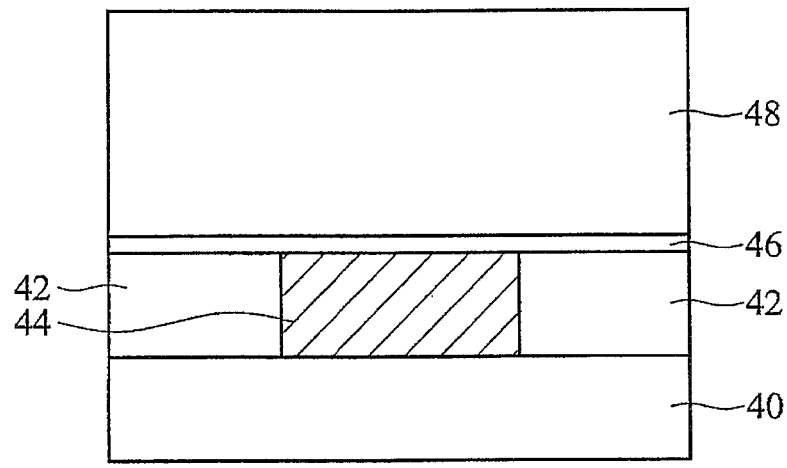
FIGS. 4 through 7 are cross-sectional views of intermediate stages in the making of a preferred embodiment of the present invention.

FIGS. 4 through 7 are cross-sectional views of intermediate stages in the making of a preferred embodiment of the present invention. It is to be noted that the cross-sectional views are taken in a plane perpendicular to the length direction of the conductive lines formed. Therefore, conductive lines appear to be rectangles. FIG. 4 illustrates the formation of a lower-layer conductive line 44 on a base material 40. The lower-layer conductive line 44 is preferably a metal comprising tungsten, aluminum, copper, silver, gold, alloy thereof, compounds thereof, and combinations thereof. It can also be formed of other materials such as doped polysilicon. Base material 40 is typically an inter-layer dielectric (ILD) also sometimes known as a pre-metal dielectric (PMD) or an inter-metal dielectric (IMD) layer. It can also be formed of other non-conductive materials such as a contact etching stop layer (CESL).

An ILD layer 42 is formed beside the low-layer conductive line 44. The ILD layer 42 is preferably silicon dioxide deposited using, e.g., tetraethyl orthosilicate (TEOS), chemical vapor deposition (CVD), plasma enhanced CVD (PECVD), low pressure CVD (LPCVD), or other well-known deposition techniques. ILD 42 can also be other materials such as phospho-silicate glass (PSG) or other known materials. Typically, ILD layer 42 has a low dielectric constant (K value) so that the parasitic capacitance between conductive lines is reduced.

FIG. 4 also shows an etching stop layer (ESL) 46 formed on the lower-layer conductive line 44. The ESL 46 is preferably a dielectric formed of an oxide or other materials such as silicon nitride. An ILD 48 is formed on the ESL 46. The ILD 48 provides insulation between the lower-layer conductive line 44 and overlying conductive lines that will be formed subsequently.

Figure 5:
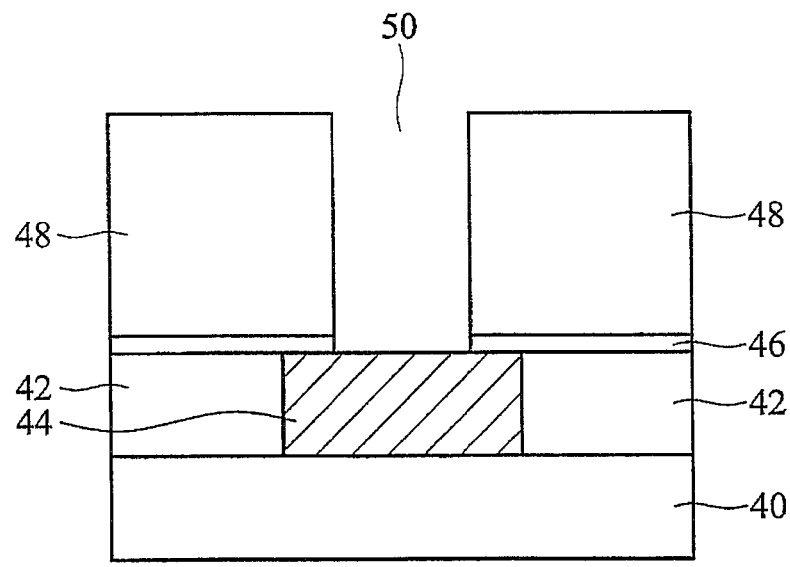

FIG. 5 illustrates a via opening 50 formed in the ILD 48 and ESL 46. A photo resist material (not shown) is formed and patterned over the ILD 48. The via opening 50 is formed in the ILD 48 and stops at the ESL 46. The ESL 46 protects the underlying lower-layer conductive line 44 when the ILD 48 is etched. Next, the exposed portion of ESL 46 is etched. Because the ESL 46 is quite thin relative to the ILD 48, process control and end-point detection are much more closely controlled, thus limiting the likelihood of over-etching through the underlying lower-layer conductive line 44.

Figure 6:
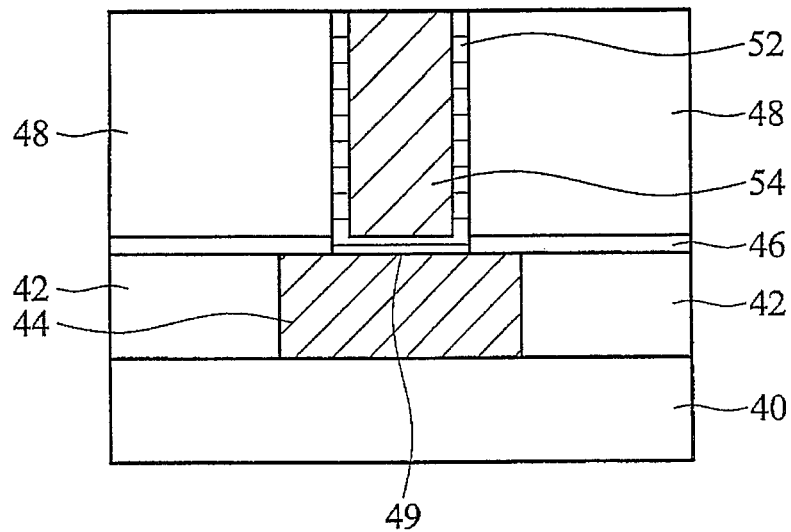

FIG. 6 illustrates the device after via 54 is formed in the contact openings. In the preferred embodiment, via 54 is formed of tungsten, aluminum, copper, silver, gold, or combinations and other well-known alternatives. In other embodiments, it can be formed of doped polysilicon. Preferably, via 54 has a composite structure, including a barrier layer 52 formed of a material comprising titanium, titanium nitride, tantalum, tantalum nitride, silicon carbide, silicon oxycarbide, combinations thereof, and other layers. The barrier layer 52 prevents the via material from diffusing into the ILD 48, which would cause device failure. The thickness of the barrier layer 52 is preferably between about 10 Å to about 1000 Å, more preferably about 300 Å. Barrier layer 52 and lower-layer conductive line 44 share an interface 49.

Figure 7:
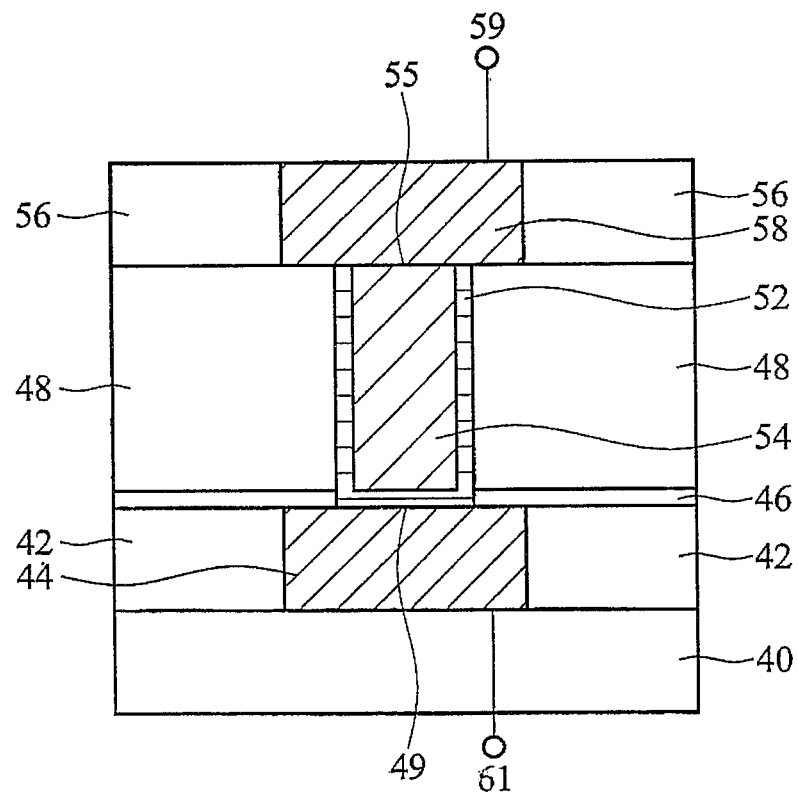

An upper-layer conductive line 58 and an ILD 56 are then formed using the methods mentioned in previous paragraphs, as illustrated in FIG. 7. The upper-layer conductive line 58 is in a layer higher than the layer in which the lower-layer conductive line 44 is formed. Interface 55 exists between via 54 and the upper-layer conductive line 58. Both lower-layer conductive line 44 and upper-layer conductive line 58 are coupled to external pads 59 and 61, respectively. External pads 59 and 61 are formed at the surface of the chip. The structure formed in previous steps results in an electrical fuse that is defined in a region comprising via 54, interfaces 49 and 55, and surrounding regions. By applying a voltage to external pads 59 and 61, a current flows through the fuse and a discontinuity is formed in the fuse region.

Figure 8:
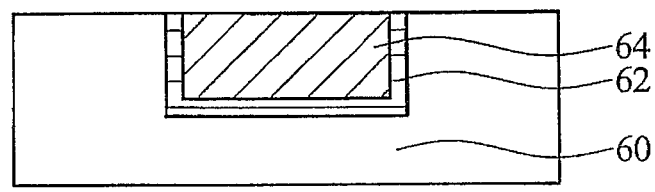
FIGS. 8 through 12 are cross-sectional views of intermediate stages in the making of a preferred embodiment of the present invention using a damascene process.

In another preferred embodiment, the conductive lines and via are formed of copper. Copper has better conductivity and can withstand higher current so that it is widely used for 0.13 µm and below. However, it is hard to etch. Therefore a damascene process is used. FIGS. 8 through 12 are cross-sectional views of intermediate stages in the making of a preferred embodiment of the present invention using a damascene process. FIG. 8 illustrates the formation of a lower-layer copper line 64. It is formed by forming a trench in the ILD 60, depositing a barrier layer 62 in the trench, depositing copper, and performing a CMP to polish the copper to the surface of the trench.

Figure 9:
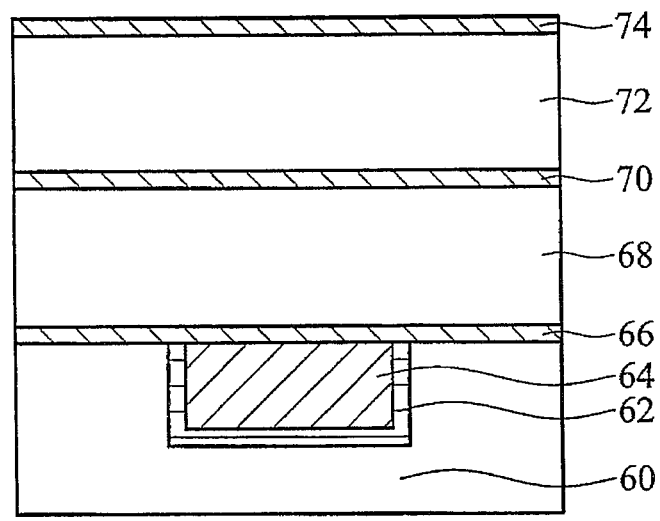
Figure 10:
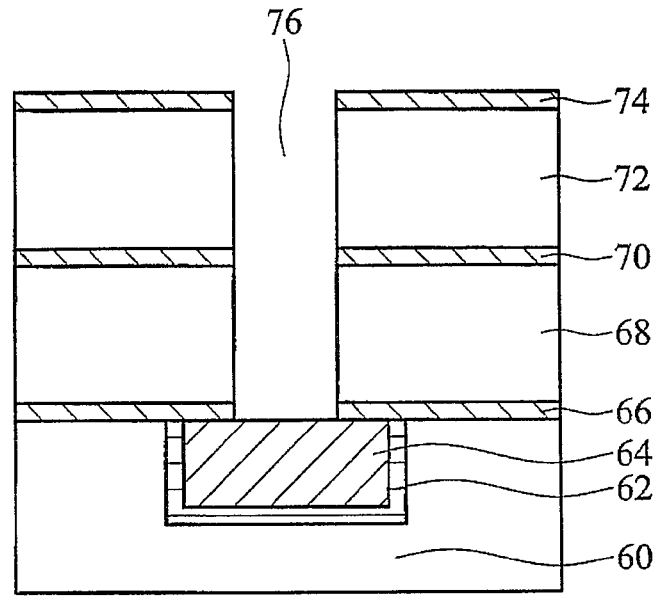
Figure 11:
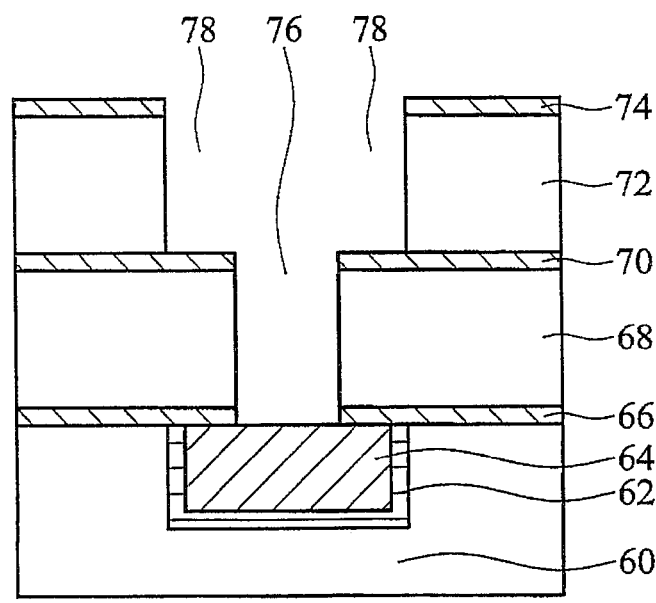
Figure 12:
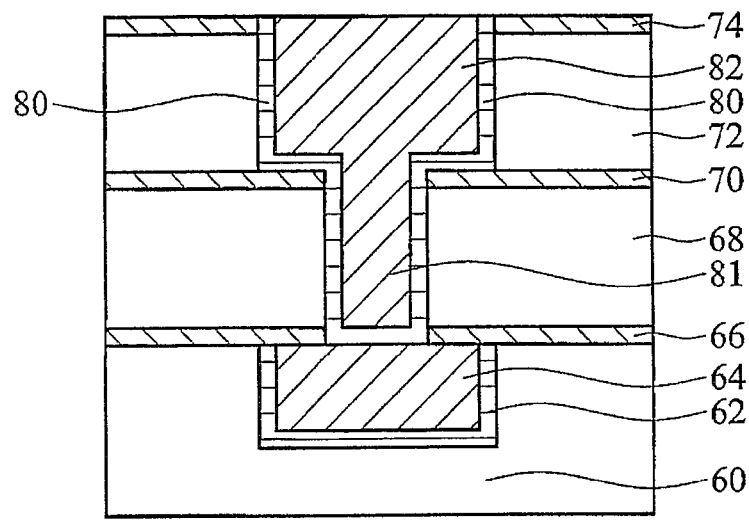

A dual damascene process is preferably performed to form a via and an upper-layer copper line. As shown in FIG. 9, a first etch stop layer 66, a first ILD 68, a second etch stop layer 70, a second ILD 72, and a hard mask 74 are formed. The materials and methods of forming these layers are known in the art. FIG. 10 illustrates a first opening 76 formed down to the first etch stop layer 66. A second opening 78 is formed in the second ILD 72. Then the exposed portion of the first etch stop layer 66 is removed. The resulting structure is shown in FIG. 11. FIG. 12 illustrates a structure with upper-layer copper line 82 and via 81. A barrier layer 80 is conformally deposited in the openings 76 and 78. Copper is then deposited in the openings. A CMP is performed to planarize the copper to the surface of upper-layer copper line 82.

Figure 13:
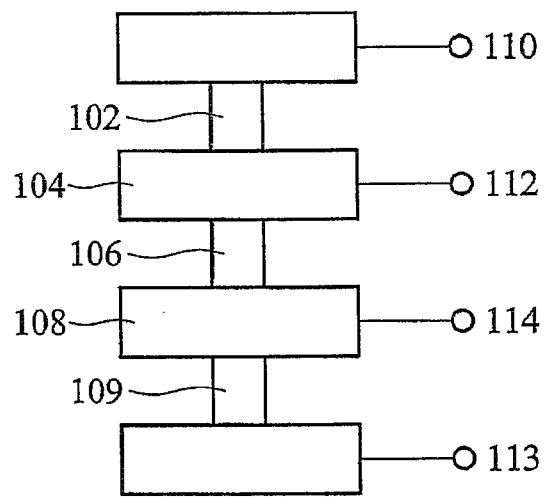
FIG. 13 illustrates three vias stacked.

Electrical fuses can be formed at different levels based on the requirements of the circuit design. FIG. 13 illustrates a stacked via string coupled between conductive lines 110 and 113. Vias 102, 106, and 109 are formed in different layers and are interconnected by conductive islands 104 and 108. Islands 104 and 108 are coupled to external pads 112 and 114, respectively. Therefore, the vias can be burned out individually. The via string can also be used as one via. When a voltage is applied between pads 110 and 113, the weakest via is burned out first and the whole via string is open. In a different embodiment of the present invention, the cross section of a via can take the shape of square, rectangle, circle or other shapes. A via can also be tapered.

Figure 14A:
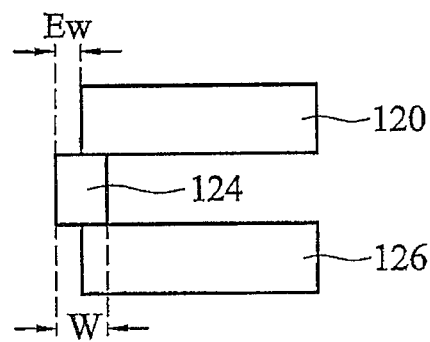
FIGS. 14a and 14b illustrate borderless and non-borderless vias.
Figure 14B:
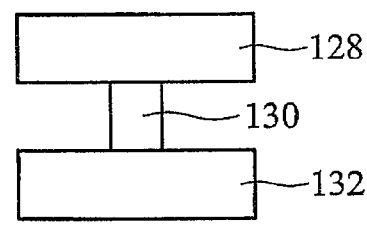

The e-fuse structure of the present invention can be non-borderless or borderless. FIG. 14a illustrates a borderless structure. A via 124 is misaligned with at least one of the conductive lines 120 and 126. Part of the via 124 extends out of the conductive lines 120 and 126. The extension width $E_w$ is preferably less than about ¾ of the via width W. The misalignment typically does not affect the function of the electrical fuse. It only lowers the current needed to burn the fuse. In a non-borderless structure, the via 130 has no extension beyond conductive lines 128 and 132, as shown in FIG. 14b.

Figure 15A:
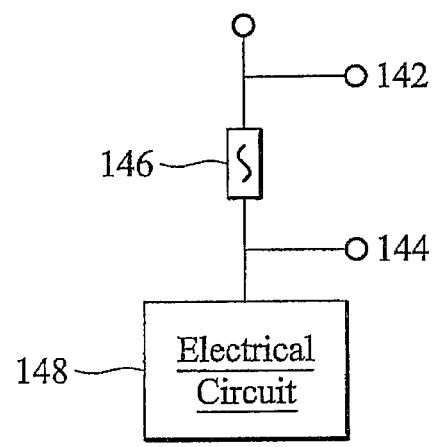
FIGS. 15a and 15b illustrate an application of the preferred embodiment of the present invention.
Figure 15B:
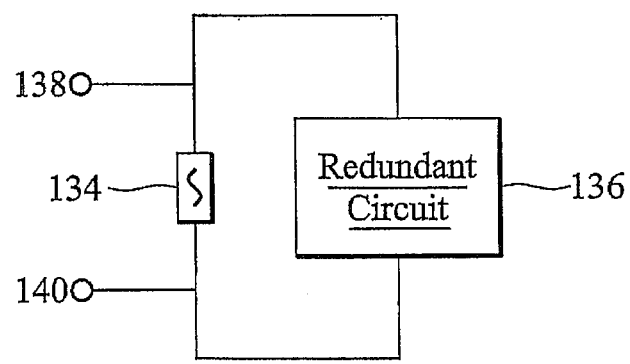

FIGS. 15a and 15b illustrate applications of the preferred embodiment. FIG. 15a illustrates an electrical circuit 148 coupled in series with a fuse 146. The electrical circuit could be a circuit that may be replaced when it malfunctions. When the fuse 146 is burned out by applying a current through external pads 142 and 144, the electrical circuit 148 is disconnected from the other circuits. FIG. 15b illustrates an e-fuse 134 coupled in parallel with a redundant circuit 136. One end of the e-fuse 134 is coupled to the ground. Therefore the redundant circuit 136 is grounded by the e-fuse 134 and not activated. If a circuit element is found defective and needs to be replaced by the redundant circuit 136, a voltage is applied to external pads 138 and 140 to burn the e-fuse 134. When the e-fuse 134 is open, the redundant circuit 136 is activated. A circuit redundancy scheme can be established by combining the circuits in FIG. 15a and FIG. 15b.

Figure 16:
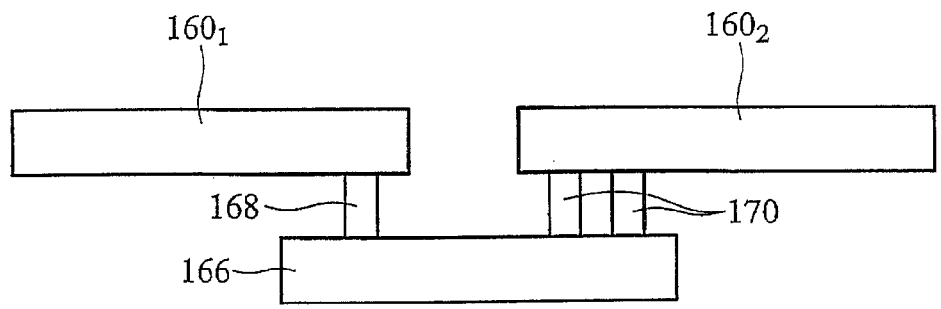
FIGS. 16 through 18 illustrate another preferred embodiment of the present invention.
Figure 17:
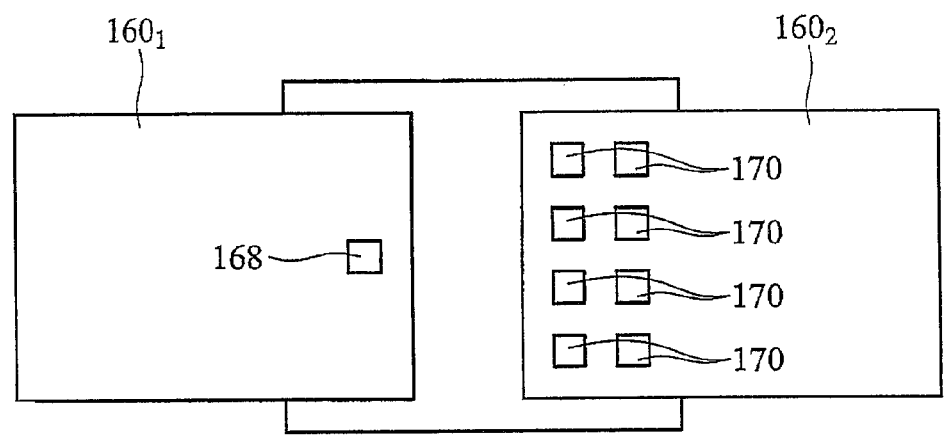

FIGS. 16 and 17 illustrate another embodiment of the present invention. FIG. 16 is a cross sectional view of the embodiment. A fuse comprising a via 168, a second-level conductive line 166, and a via group 170 is formed between two portions $160_1$, $160_2$ of a conductive line 160. Conductive lines 160 and 166 are also referred to as conductive layers. Conductive line $160_1$ is the cathode end and conductive line $160_2$ is the anode end. FIG. 17 is a top view of the embodiment. At the anode end, via group 170 comprises two or more vias and can sustain higher current density than the via 168. With the asymmetric design, when the same current flows through via 168 and via group 170, via 168 has higher current density than vias in the via group 170 and thus is more prone to be burned out. Although FIG. 16 illustrates a preferred embodiment in which conductive line 166 is formed in a lower metal layer than conductive lines $160_1$ and $160_2$, they may have different relative positions in other embodiments. For example, assuming line $160_1$ is in metal layer m, the conductive line 166 may be in metal layer m−1, m+1, and metal lines $160_2$ may be in other metal layers such as metal layer m−2, m+1, m+2, etc.

Figure 18:
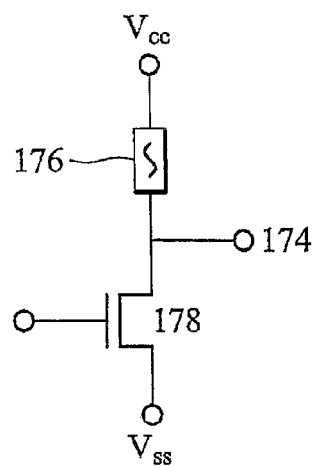

FIG. 18 illustrates a circuit for burning out a fuse. A fuse 176 is connected in series with a transistor 178, which in this configuration is preferably an nMOS device. The fuse 176 and the transistor 178 are coupled between power nodes $V_{cc}$ and $V_{ss}$, wherein the source of the transistor 178 is connected to $V_{ss}$, and the drain is connected to the fuse 176. When a high voltage is applied to the gate of the transistor 178, transistor 178 conducts. A current flows through and burns fuse 176. If the fuse to be burned has an asymmetric design as in FIGS. 16 and 17, it is preferred that the cathode of the fuse, which is the single via end, is coupled to node 174, and the anode is coupled to the high power supply node $V_{cc}$. It is easier to burn the fuse with such a connection. When a fuse illustrated in FIGS. 16 and 17 is used as the fuse 176, the cathode end $160_1$ is preferably connected to the drain of the transistor 178, and the anode end $160_2$ is preferably connected to the power node $V_{cc}$.

The current density required for burning out a fuse is dependent on the material of the via and conductive lines, and the process used. One skilled in the art can find the right current density through routine experiment. Table 1 presents exemplary data measured on the vias formed using 90 nm technology.

| Layer | Dimension (μm) | Burn-out Current (mA) | Burn-out Current density (A/cm²) |
|---|---|---|---|
| M1 | 0.12 × 0.25 | 0.200 | 6.66 × 10⁵ |
| M2~M7 | 0.14 × 0.325 | 0.312 | 6.86 × 10⁵ |
| M8, M9 | 0.42 × 0.9 | 2.880 | 7.62 × 10⁵ |
| Contact | 0.12 × 0.12 | 0.294 | 2.04 × 10⁶ |
| Via 1~Via 6 | 0.13 × 0.13 | 0.189 | 1.12 × 10⁶ |
| Via 7, Via 8 | 0.36 × 0.36 | 1.452 | 8.8 × 10⁵ |
| All stacked vias except Via7 and 8 | 0.13 × 0.13 | 0.189 | 1.12 × 10⁶ |
| Stacked vias with Via 7 and Via 8 | 0.36 × 0.36 | 1.452 | 8.8 × 10⁵ |

M1 through M9 are metal lines at different layers, with M9 being the top layer metal, and M1 being the bottom layer metal. Via 1 is between M1 and M2. Via 2 is between M2 and M3, and via 8 is between M8 and M9. Typically, M8 and M9 are power lines so that they have the greatest thickness of 0.9 μm, which is the second value found in their dimensions. The dimensions of M1 through M9 indicate width×thickness, and dimensions for vias indicate cross sectional dimensions.

In table 1, rows marked as M1 through M9 present the current and current density needed to burn out the metal lines. Rows marked as via 1 through via 8 present the current and current density needed to burn out the vias. The burn-out current density is calculated based on the burn-out current divided by the cross sectional area, which in turn can be calculated from the dimension. While the current density to burn out the via is affected by the material and process, the current for burning out a via is also affected by the cross sectional area. Preferably, the cross sectional area of the via is between about $1 \times 10^{-4}$ μm² to about 1 μm². By adjusting the cross sectional area for an e-fuse or a portion of an e-fuse, the burn-out current can be adjusted into a desired range. One skilled in the art can take the factors such as the material, process, dimension, current, and current density into consideration so that the structure comprising upper-layer conductive line, lower-layer conductive line, and the via is adapted to be an e-fuse.

It is observed that in order to burn out the vias or the metal lines, the required current density is in the order of about $10^5$ A/cm² to about $10^6$ A/cm². Although the data shows that the burn-out current density of metal lines are in the same order as, or sometimes even lower than the burn-out current density of vias, which suggests that the burn-out region should occur in metal lines instead of vias, the experiment results have revealed that the burn-out regions are typically in the via or close to the interfaces between the via and metals lines (refer to FIGS. 16a and 16b), providing the burn-out current densities for metal lines are not too much lower than for vias. This result has indicated that the vias are suitable for e-fuses.

There is no special requirement as to the height of a via. The height is preferably determined by the distance between metal layers. This provides flexibility in the design of the fuse since the fuse design can be easily integrated into the chip design without incurring extra processing steps and cost. In a preferred embodiment, the height is between about 500 Å to about 10000 Å.

Figure 19A:
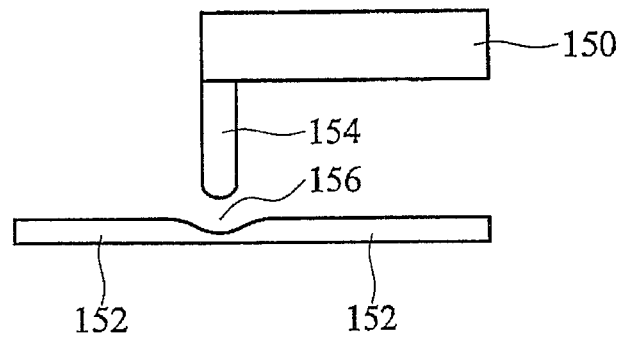
FIGS. 19a and 19b illustrate burned out fuses.
Figure 19B:
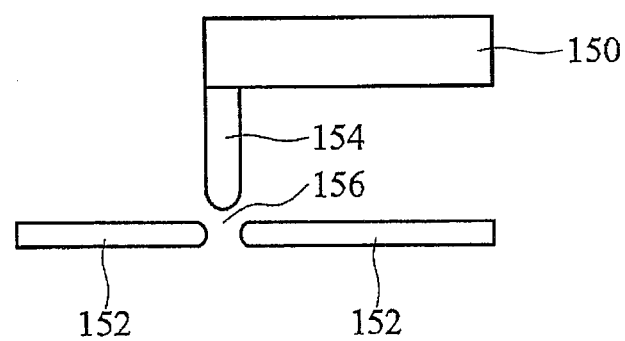

FIGS. 19a and 19b illustrate side views of two examples of burned fuses 154, which are coupled between two respective conductive lines 150 and 152, of the present embodiment. Typically, the burned out region 156 is close to the interfaces between the via and the upper-layer/lower-layer conductive lines. In FIG. 19a, the burned out region 156 is mainly in via 154. In FIG. 19b, the burned out region 156 extends to one of the conductive lines 152.

There are several advantages features provided by the embodiments of the present invention. These include (but are not limited to): first, higher repairable rate can be achieved since the burn out process is easier to control and more reliable. Second, fewer masking layers are required therefore reducing cost. Third, the preferred embodiments provide a flexible structure for circuit designers. The fuse may reside in any region of the inter layer vias for cell size reduction.

The preferred embodiment of the present invention presents a method of forming an electrical fuse having a vertical structure.

In accordance with one aspect of the present invention, a first-layer conductive line is formed on a base material. A via is formed over the first-layer conductive line. The via preferably comprises a barrier layer and a conductive material. A second-layer conductive line is formed over the via. A first external pad is formed coupling the first-layer conductive line. A second external pad is formed coupling the second-layer conductive line. The via, first-layer conductive line, and second-layer conductive line are adapted to be an electrical fuse.

In accordance with another aspect of the present invention, copper is used in the via, the first-layer conductive line, and the second-layer conductive line. Single or dual damascene processes are used to form the via, the first-layer conductive line and the second-layer conductive line.

The vertical structure of the preferred embodiment is suitable to be formed in any layer and saves layout space. The embodiments of the present invention have several advantageous features. Firstly, higher repairable rates can be achieved since the burn out process is easier to control and more reliable. Secondly, fewer masking layers are required, therefore reducing costs. Thirdly, the fuse may reside in any region of the inter layer vias for cell size reduction. This provides a flexible structure for circuit design.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
    applying a voltage differential between an anode of a fuse and a cathode of the fuse, wherein a first number of conductive vias extend from the anode and are electrically coupled between the anode and the cathode, wherein a second number of conductive vias extend from the cathode and are electrically coupled between the anode and the cathode, the first number being different than the second number;
    wherein the voltage differential forms a discontinuity between the anode and the cathode.

2. The method of claim 1, wherein the anode and the cathode are positioned in different metallization layers.

3. The method of claim 1, wherein the anode and the cathode are positioned in a same metallization layer, wherein the anode and the cathode are interconnected by a conductive line in a different metallization layer, and wherein the anode is electrically coupled to the conductive line by the first number of conductive vias, and wherein the cathode is electrically coupled to the conductive line by the second number of conductive vias.

4. A method comprising:
    electrically coupling a first node of a fuse to Vss;
    electrically coupling a second node of the fuse to Vcc; and
    causing a programming current to flow from the first node of the fuse to the second node of the fuse, one or more first conductive vias, a conductive line, and one or more second conductive vias being interposed in between the first node and the second node, wherein a number of the first conductive vias is different than a number of second conductive vias, wherein the programming current causes a discontinuity to form in one or more of the one or more first conductive vias.

5. The method of claim 1, wherein the second number is greater than the first number.

6. The method of claim 1, wherein the discontinuity forms at an end of a first conductive via, the first conductive via comprising one of the first number of conductive vias or one of the second number of conductive vias.

7. The method of claim 6, the first conductive via has a cross sectional area of between about $10^{-4}$ $\mu m^2$ and about 1 $\mu m^2$.

8. The method of claim 6, the first conductive via has a height of between about 500 Å and about 1 $\mu m$.

9. A method comprising:
    electrically coupling a first voltage source to a first contact pad, wherein the first contact pad is electrically coupled to an anode of a fuse;
    electrically coupling a second voltage source to a second contact pad, wherein the second contact pad is electrically coupled to a cathode of the fuse, wherein a current path between the anode and the cathode passes through one or more first conductive vias; and
    adjusting the first voltage source and the second voltage source such that a current flowing through the one or more first conductive via causes a discontinuity between at least one of the one or more first conductive vias and one of the anode and the cathode, wherein the current flowing between the anode and the cathode passes through a conductive line, wherein the conductive line is electrically coupled directly to the anode by the one or more first conductive vias and is electrically coupled directly to the cathode by one or more second conductive vias, wherein a number of first conductive vias is different than a number of second conductive vias.

10. The method of claim 9, wherein one of the anode and the cathode is in a first dielectric layer, another of the anode and the cathode is in a second dielectric layer, the second dielectric layer being different than the first dielectric layer.

11. The method of claim 9, wherein the anode is formed in a first metallization layer and the cathode is formed in a second metallization layer, the first metallization layer is adjacent to the second metallization layer, and wherein, prior to the adjusting, the one or more first conductive vias extends between the first metallization layer and the second metallization layer.

12. The method of claim 10, wherein the conductive line is in a different dielectric layer than the anode and the cathode.

13. The method of claim 9, wherein the one or more first conductive vias is a single conductive via, and wherein the one or more second conductive vias is two or more conductive vias.

14. The method of claim 4, wherein the one or more first conductive vias has a height of between about 500 Å and about 1 $\mu m$.

15. The method of claim 4, wherein the first node and the second node are in different metallization layers.

16. The method of claim 4, wherein the first node is formed in a first metallization layer and the second node is formed in a second metallization layer, the one or more first conductive vias extends from the first node towards the second node.

17. The method of claim 4, wherein the first node is electrically coupled to the conductive line by only a single conductive via.

18. The method of claim 4, wherein the one or more first conductive vias is a single via, and the single via has a cross sectional area of between about $10^{-4}$ $\mu m^2$ and about 1 $\mu m^2$.

19. The method of claim 4, wherein the one or more first conductive vias are electrically interposed between an anode and the conductive line.

20. The method of claim 19, wherein the number of first conductive vias is less than the number of second conductive vias.

* * * * *